US012642043B2

(12) United States Patent
Shibata

(10) Patent No.: US 12,642,043 B2
(45) Date of Patent: May 26, 2026

(54) SUBSTRATE PROCESSING APPARATUS AND SUBSTRATE PROCESSING APPARATUS CONTROL METHOD

(71) Applicant: SCREEN Holdings Co., Ltd., Kyoto (JP)

(72) Inventor: Tetsuya Shibata, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 547 days.

(21) Appl. No.: 18/330,887

(22) Filed: Jun. 7, 2023

(65) Prior Publication Data

US 2023/0411189 A1 Dec. 21, 2023

(30) Foreign Application Priority Data

Jun. 20, 2022 (JP) ................................. 2022-098738

(51) Int. Cl.
*H01L 21/673* (2006.01)
*H01L 21/67* (2006.01)
*H01L 21/68* (2006.01)

(52) U.S. Cl.
CPC .. *H01L 21/67253* (2013.01); *H01L 21/67017* (2013.01); *H01L 21/67265* (2013.01);
(Continued)

(58) Field of Classification Search
CPC ......... H01L 21/67253; H01L 21/67265; H01L 21/67294; H01L 21/681; H01L 21/67242; H01L 21/67023; H01L 21/683; H01L 21/67259; H01L 21/67057; H01L 21/67757; H01L 21/67017;
(Continued)

(56) References Cited

U.S. PATENT DOCUMENTS

| | | | |
|---|---|---|---|
| 6,064,429 A | 5/2000 | Belk et al. | |
| 6,391,113 B1 | 5/2002 | Konishi et al. | |

(Continued)

FOREIGN PATENT DOCUMENTS

| | | |
|---|---|---|
| CN | 112640055 A | 4/2021 |
| JP | H02-302879 A | 12/1990 |

(Continued)

OTHER PUBLICATIONS

Notice of Decision to Grant dated Jul. 1, 2024 issued in corresponding Korean Patent Application No. 10-2023-0073092.

(Continued)

*Primary Examiner* — Eduardo A Rodela
(74) *Attorney, Agent, or Firm* — OSTROLENK FABER LLP

(57) ABSTRACT

A substrate processing method includes: a first step of causing, in a state of a substrate holding mechanism not holding a plurality of substrates, a camera to capture an image of the substrate holding mechanism and an image of an interior to generate first image data; a second step of identifying, in a first region indicated by the first image data, a second region being a region in which at least the image of the substrate holding mechanism has been captured; and a third step of comparing a gradient of the first image data distributed in a third region being a region in the first region other than the second region with a threshold for the gradient.

20 Claims, 9 Drawing Sheets

(52) U.S. Cl.
CPC ...... *H01L 21/67294* (2013.01); *H01L 21/673*
(2013.01); *H01L 21/681* (2013.01)

(58) Field of Classification Search
CPC ......... H01L 21/67303; H01L 21/67313; H01L
21/6732; H01L 21/67326; H01L
21/67706; H01L 22/12; H01L 22/20;
H01L 22/30; H01L 21/67005; H01L
21/673; H01L 21/677; G06T 7/0008;
G06T 7/11; G06T 2207/30148
See application file for complete search history.

(56) References Cited

U.S. PATENT DOCUMENTS

| | | | | |
|---|---|---|---|---|
| 10,713,772 | B2 | 7/2020 | Amano et al. | |
| 11,309,194 | B2 * | 4/2022 | Tanaka | H01L 21/67313 |
| 11,699,601 | B2 * | 7/2023 | Takahashi | H01L 21/67253 |
| | | | | 438/800 |
| 12,488,452 | B2 * | 12/2025 | Estrella | H01L 21/67057 |
| 2007/0177788 | A1 | 8/2007 | Liu | |
| 2018/0174877 | A1 | 6/2018 | Ito | |
| 2019/0080937 | A1 * | 3/2019 | Tsuchiya | H01L 21/67253 |
| 2021/0391190 | A1 | 12/2021 | Ohashi et al. | |

FOREIGN PATENT DOCUMENTS

| | | | |
|---|---|---|---|
| JP | H10-125765 | A | 5/1998 |
| JP | H10-303283 | A | 11/1998 |
| JP | H11-176912 | A | 7/1999 |
| JP | H11-352073 | A | 12/1999 |
| JP | 2002-267616 | A | 9/2002 |
| JP | 2005-321415 | A | 11/2005 |
| JP | 2016-218018 | A | 12/2016 |
| JP | 2018-179761 | A | 11/2018 |
| JP | 2018-195735 | A | 12/2018 |
| JP | 2019-050349 | A | 3/2019 |
| KR | 10-2009-0064319 | A | 6/2009 |
| KR | 10-2515301 | B1 | 3/2023 |
| WO | WO 2016/121628 | A1 | 8/2016 |

OTHER PUBLICATIONS

Notice of Decision to Grant dated Apr. 23, 2024 issued in corresponding Japanese Patent Application No. 2022-098738.

Office Action and Search Report dated Jul. 9, 2024 in corresponding Taiwanese Patent Application No. 112116308 and English machine language translation made from the Japanese translation of the original communication.

Notice of Decision to Grant with Search Report dated Nov. 4, 2024 in corresponding Chinese Patent Application No. 202310733097.6.

* cited by examiner

F I G.  1
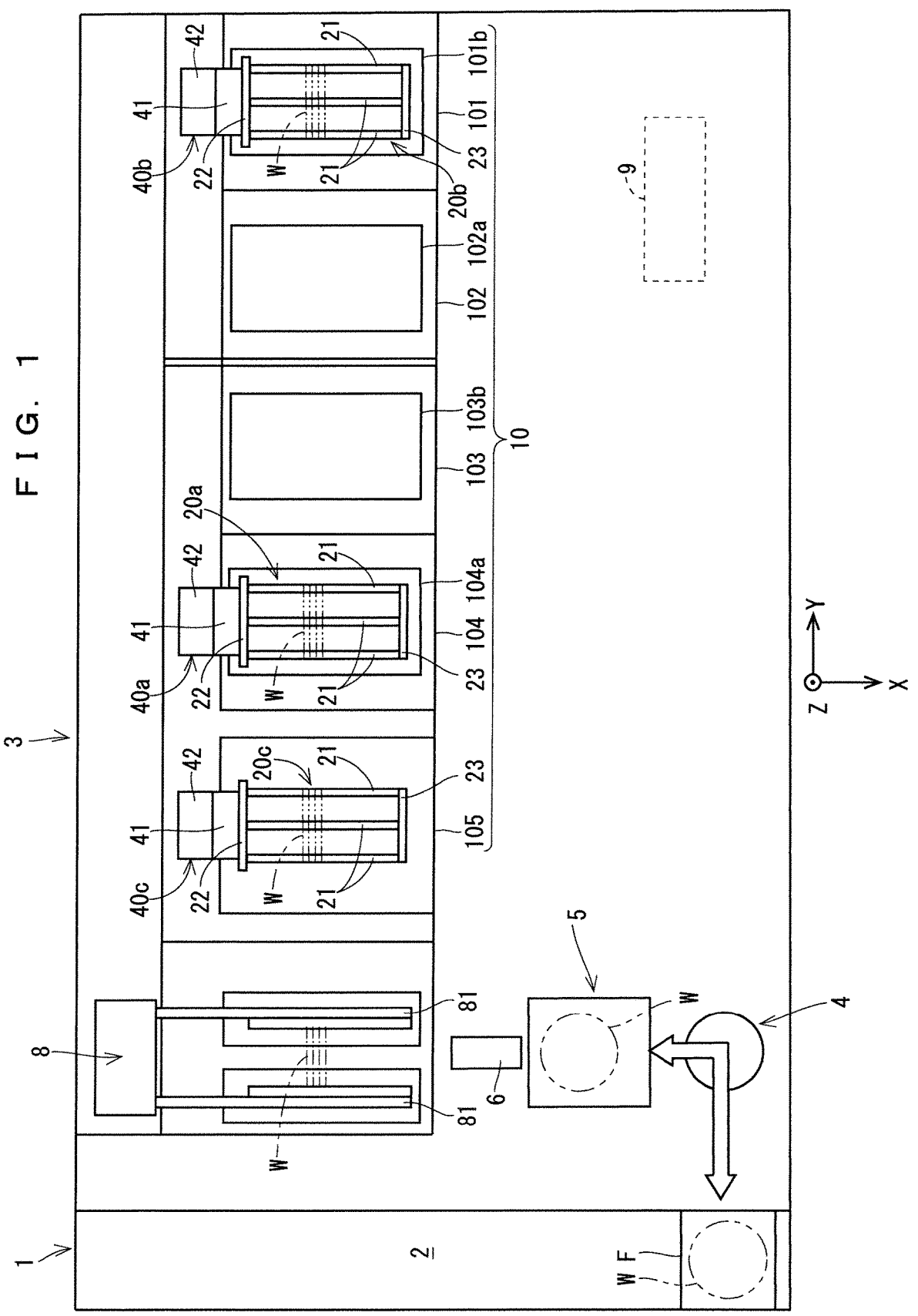

F I G 2
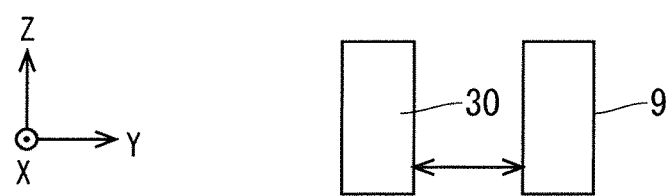
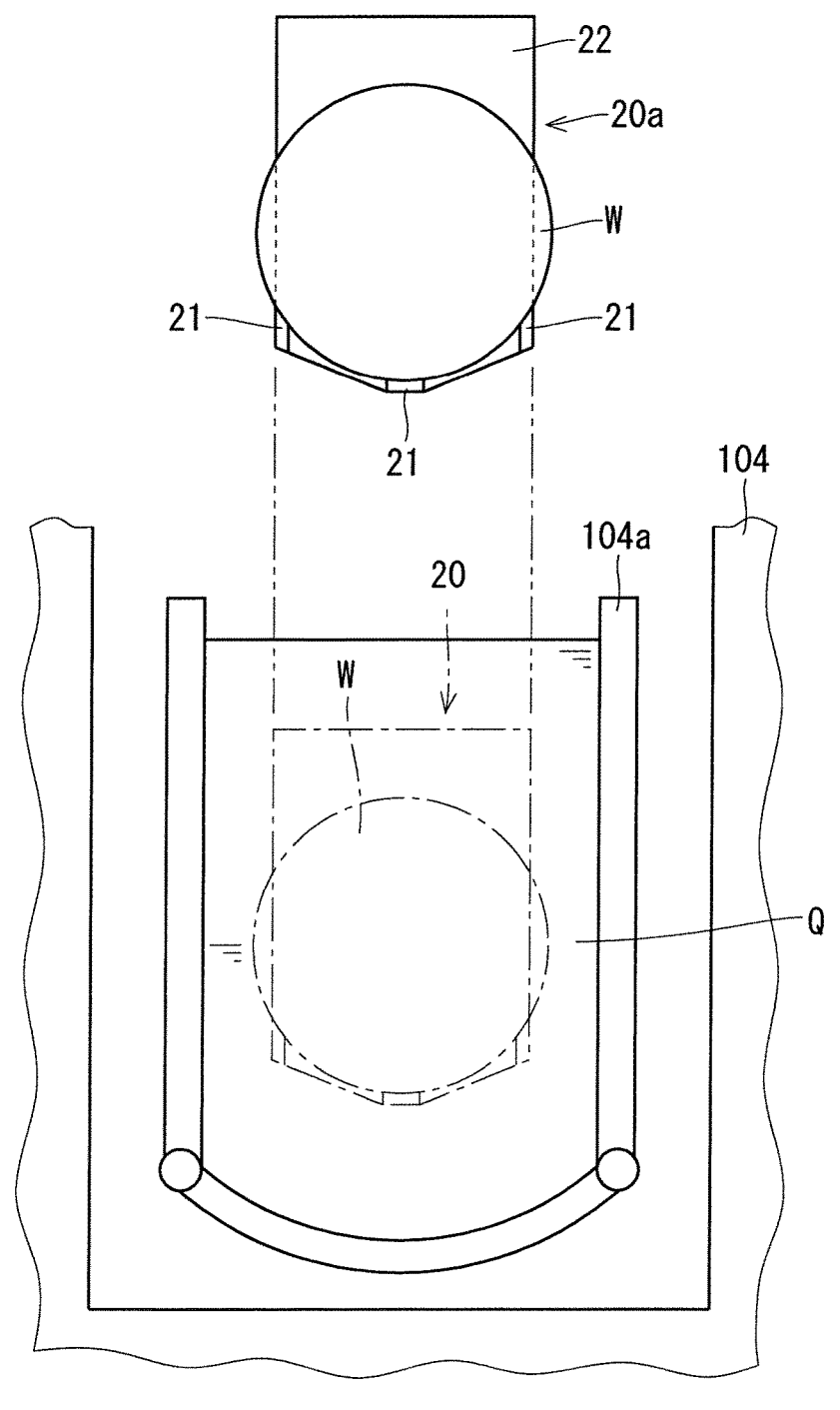

F I G.  4
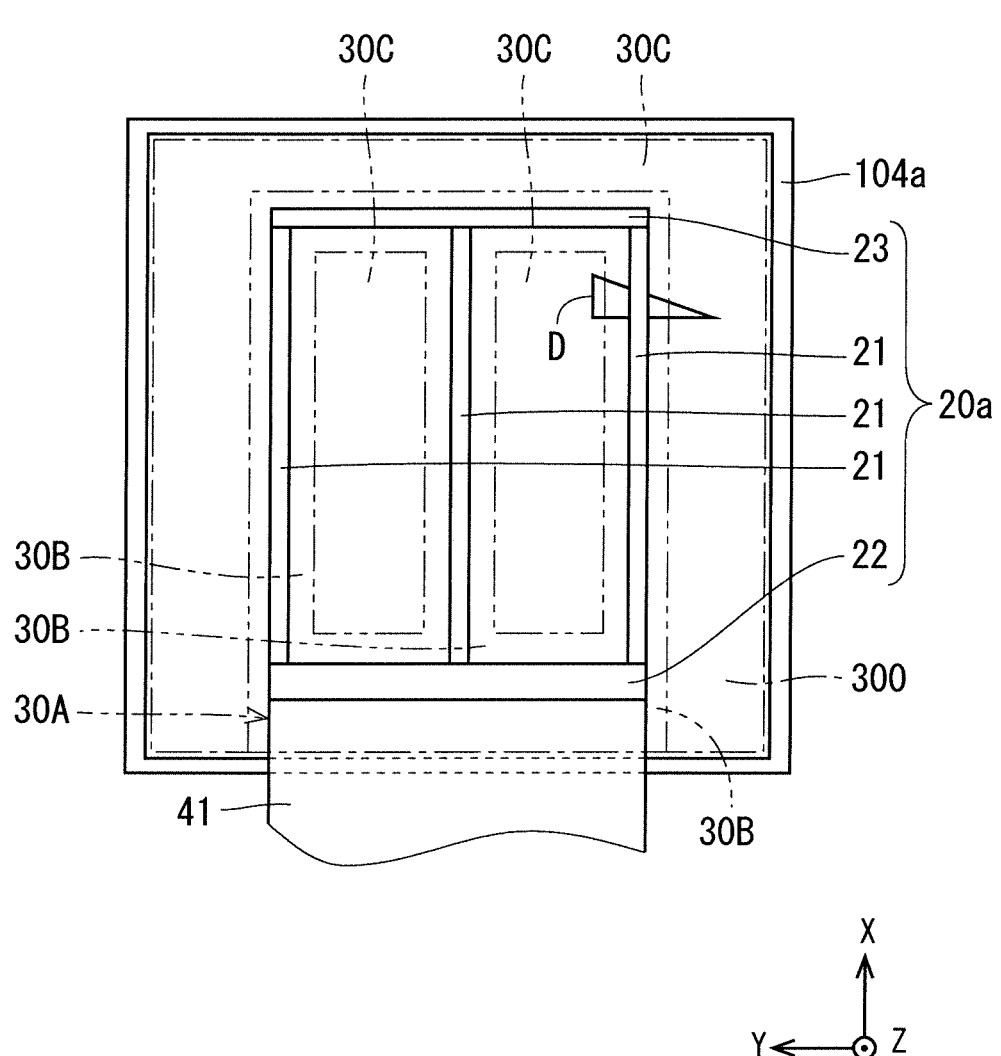

F I G.  5
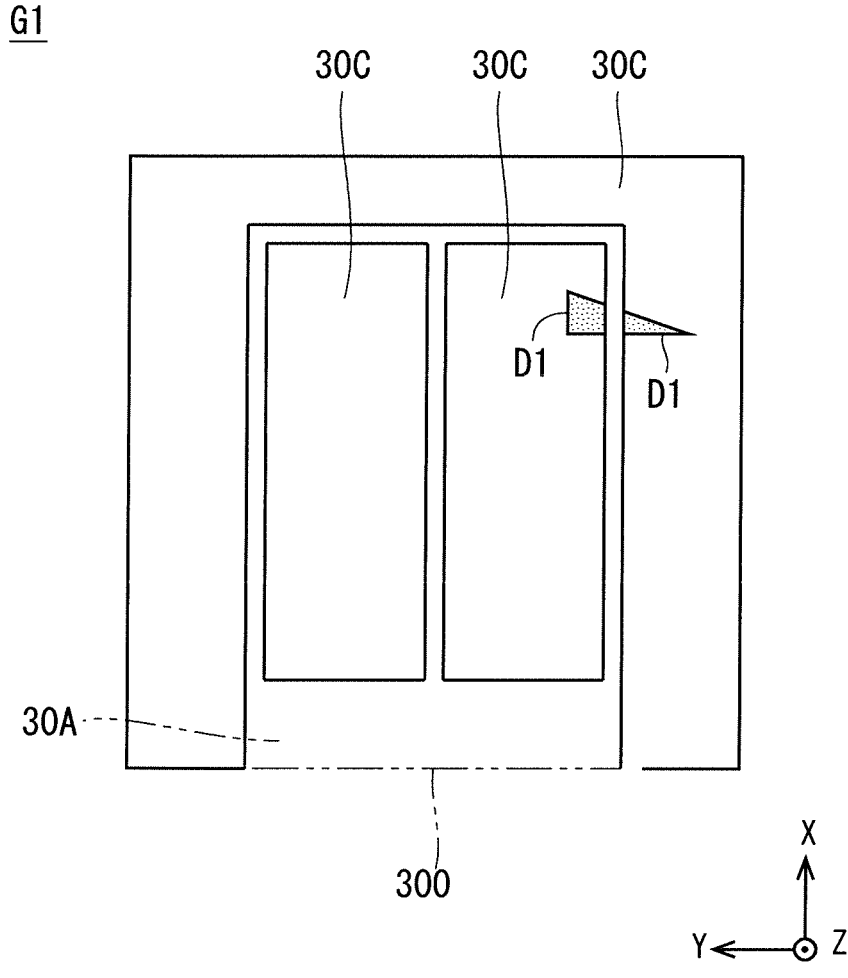

F I G. 6
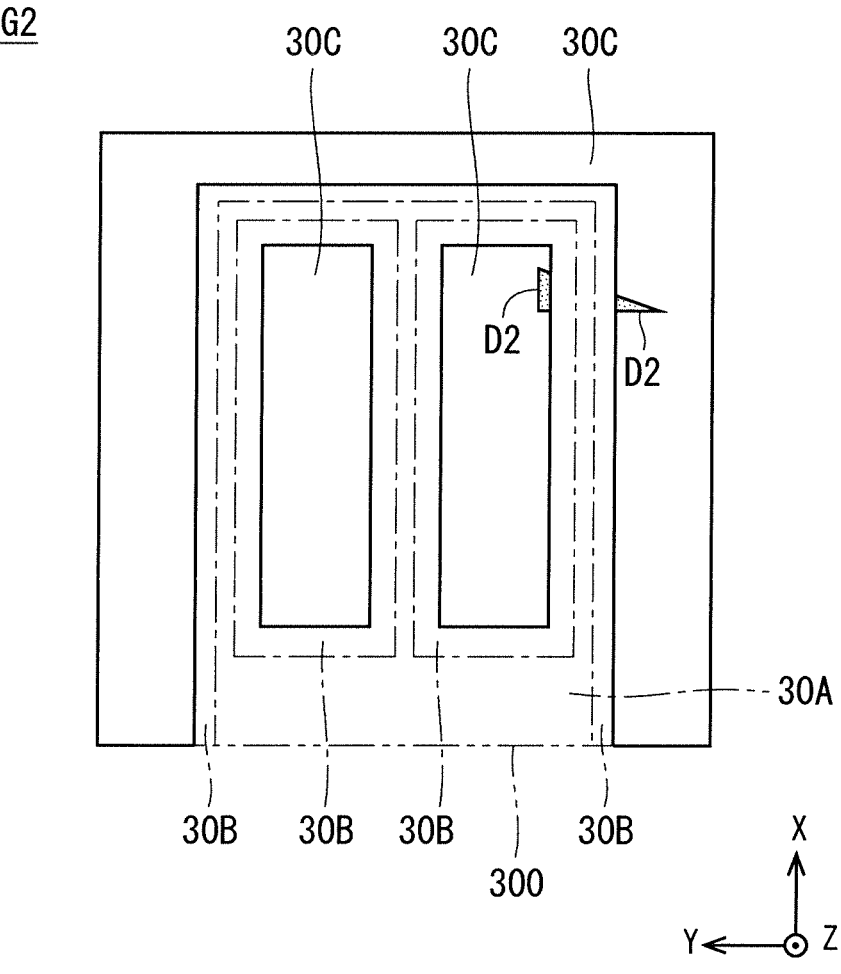

F I G. 7
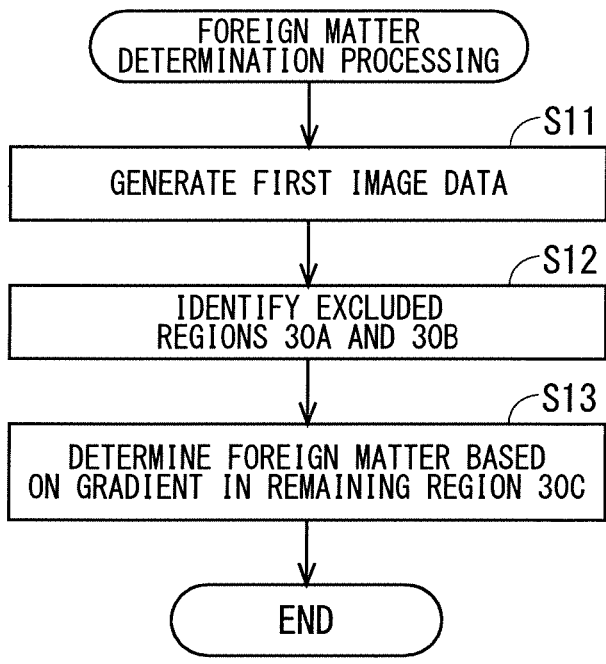

F I G　8
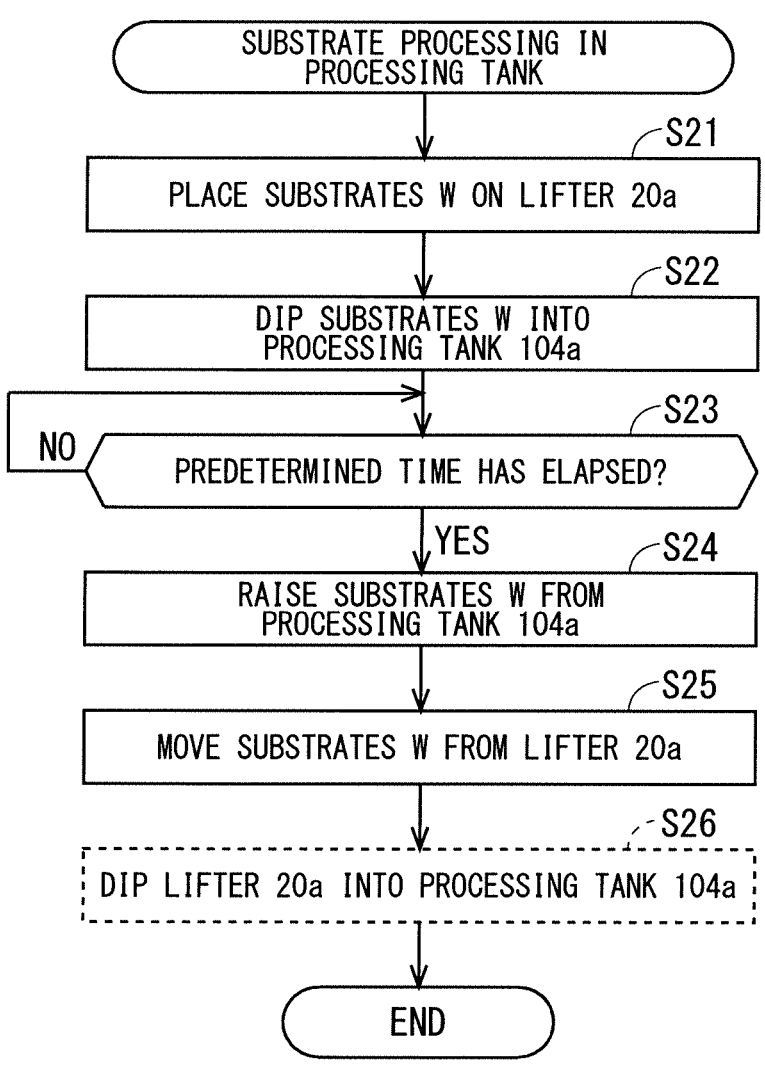

F I G.  9
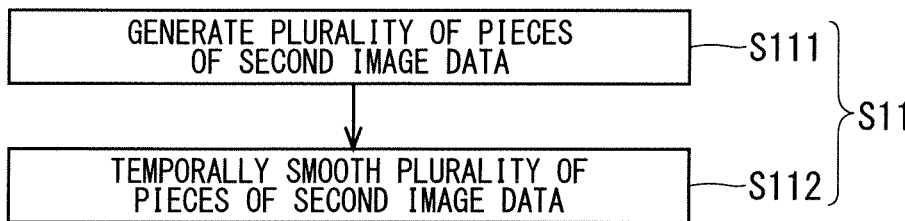

SUBSTRATE PROCESSING APPARATUS AND SUBSTRATE PROCESSING APPARATUS CONTROL METHOD

BACKGROUND OF THE INVENTION

Field of the Invention

The present disclosure relates to substrate processing apparatuses and substrate processing apparatus control methods.

Description of the Background Art

Japanese Patent Application Laid-Open No. 2019-50349 and US Patent Application Publication No. 2007/0177788 each propose a substrate processing apparatus of a batch type that collectively processes a plurality of substrates. In Japanese Patent Application Laid-Open No. 2019-50349 and US Patent Application Publication No. 2007/0177788, the substrate processing apparatus includes a processing tank to store a processing liquid. The plurality of substrates are dipped into the processing liquid stored in the processing tank to collectively process the plurality of substrates.

In Japanese Patent Application Laid-Open No. 2019-50349 and US Patent Application Publication No. 2007/0177788, an image capturing unit (a camera) is disposed to monitor the interior of the substrate processing apparatus. In Japanese Patent Application Laid-Open No. 2019-50349, the image capturing unit captures an image of the processing liquid stored in the processing tank, and a controller identifies a state of boiling of the processing liquid based on the captured image. In US Patent Application Publication No. 2007/0177788, the camera captures an image of the interior of the processing tank from vertically above, and the presence or the absence of a substrate piece in the interior of the processing tank is determined based on the captured image.

In dipping the plurality of substrates into the processing liquid, a mechanism (hereinafter referred to as a "substrate holding mechanism") having a function of collectively holding the plurality of substrates is used. The substrate holding mechanism dips the plurality of substrates into the processing liquid, and is removed from the processing liquid. The plurality of substrates collectively processed with the processing liquid are moved elsewhere from the substrate holding mechanism by another mechanism. In this case, the camera captures an image of the interior of the processing tank. Image data obtained by image capturing is used to check whether there is a fragment of a substrate or the substrate itself (hereinafter referred to as a "lost portion") in the interior.

The check is desirable from a perspective of determining the presence or the absence of any breakage and lack of the plurality of substrates moved from the substrate holding mechanism. This is because the presence of the lost portion in the interior determined by the check can be grounds for inference of the presence of any breakage and lack of the plurality of substrates moved from the substrate holding mechanism.

For example, when a first group and a second group of a plurality of substrates are dipped into the same processing liquid in turn, the substrate holding mechanism repeats elevation (this can also be appreciated as "upward and downward movement") operation with respect to the processing tank storing the processing liquid. The camera is disposed above the substrate holding mechanism from a perspective of capturing an image of the interior of the processing tank without inhibiting elevation of the substrate holding mechanism while having a smaller blind spot.

The substrate holding mechanism sometimes remains above the processing tank between movement of the first group from the substrate holding mechanism and placement of the second group on the substrate holding mechanism. In such a situation, the substrate holding mechanism is interposed between the camera and the processing tank regardless of whether the substrate holding mechanism is dipped into the processing liquid or has been removed from the processing liquid to the position above the processing tank. In such a case, an image of the interior of the processing tank is to be captured by the camera over the substrate holding mechanism.

Determination on whether there is the lost portion in the interior whose image has been captured can be made based on the breadth of a region determined to be dark in the image data. When the image of the interior of the processing tank is captured by the camera over the substrate holding mechanism as described above, an image of the substrate holding mechanism is also captured. Thus, there is a possibility that the substrate holding mechanism whose image is captured is erroneously determined as the lost portion.

SUMMARY

It is an object of the present disclosure to provide technology for reducing a possibility that a substrate holding mechanism is determined as a lost portion even if an image of the substrate holding mechanism is captured when an image of the interior of a processing tank is captured.

A substrate processing apparatus control method according to a first aspect is a substrate processing apparatus control method for controlling a substrate processing apparatus, wherein the substrate processing apparatus includes: a processing tank to store a processing liquid into which a plurality of substrates are dipped to collectively process the plurality of substrates; a substrate holding mechanism being a mechanism having a function of collectively holding the plurality of substrates; an elevator being a mechanism having a function of dipping the substrate holding mechanism into the processing liquid and a function of removing the substrate holding mechanism from the processing liquid; and a camera to capture an image of an interior of the processing tank and an image of the substrate holding mechanism from a side of the substrate holding mechanism opposite the processing tank to generate image data.

The method includes: a first step of causing, in a state of the substrate holding mechanism e.g., a substrate holder, not holding the plurality of substrates, the camera to capture the image of the substrate holding mechanism and the image of the interior to generate first image data; a second step of identifying, in a first region indicated by the first image data, a second region being a region in which at least the image of the substrate holding mechanism has been captured; and a third step of comparing a gradient of the first image data distributed in a third region with a threshold for the gradient, the third region being a region in the first region other than the second region.

A substrate processing apparatus control method according to a second aspect is the substrate processing apparatus control method according to the first aspect, wherein, in the second step, a fourth region in which an image of a shadow of the substrate holding mechanism has been captured is identified in the first region, and, in the third step, the third region is obtained by excluding the second region and the fourth region from the first region.

3

A substrate processing apparatus control method according to a third aspect is the substrate processing apparatus control method according to the first aspect, wherein the second region includes a region in which an image of at least portion of the elevator has been captured in the first region.

A substrate processing apparatus control method according to a fourth aspect is the substrate processing apparatus control method according to the third aspect, wherein, in the second step, a fourth region in which an image of a shadow of the at least portion of the elevator has been captured is identified in the first region, and, in the third step, the third region is obtained by excluding the second region and the fourth region from the first region.

A substrate processing apparatus control method according to a fifth aspect is the substrate processing apparatus control method according to any one of the first to the fourth aspects, wherein the first step is performed with the processing liquid discharged from the processing tank.

A substrate processing apparatus control method according to a sixth aspect is the substrate processing apparatus control method according to any one of the first to the fourth aspects, wherein the first step is performed with the processing liquid stored in the processing tank, and the first image data is obtained by temporal smoothing of a plurality of pieces of second image data generated by capturing the image of the interior at different times.

A substrate processing apparatus according to a seventh aspect includes: a processing tank to store a processing liquid into which a plurality of substrates are dipped to collectively process the plurality of substrates; a substrate holding mechanism being a mechanism having a function of collectively holding the plurality of substrates; an elevator being a mechanism having a function of dipping the substrate holding mechanism into the processing liquid and a function of removing the substrate holding mechanism from the processing liquid; a camera to capture an image of an interior of the processing tank and an image of the substrate holding mechanism from a side of the substrate holding mechanism opposite the processing tank to generate image data; and a controller. The controller causes, in a state of the substrate holding mechanism not holding the plurality of substrates, the camera to capture the image of the substrate holding mechanism and the image of the interior to generate first image data; identifies, in a first region indicated by the first image data, a second region being a region in which the image of the substrate holding mechanism has been captured; and compares a gradient of the first image data in a third region with a threshold for the gradient, the third region being obtained by excluding the second region from the first region.

The substrate processing apparatus control method according to the first aspect, the substrate processing apparatus control method according to the third aspect, and the substrate processing apparatus according to the seventh aspect reduce a possibility that the substrate holding mechanism is determined as a lost portion even if the image of the substrate holding mechanism is captured when image of the interior of the processing tank is captured.

The substrate processing apparatus control method according to the second aspect reduces a possibility of erroneous determination made by a shadow of the substrate holding mechanism. The substrate processing apparatus control method according to the fourth aspect reduces a possibility of erroneous determination made by a shadow of the at least portion of the elevator.

The substrate processing apparatus control method according to the fifth aspect and the substrate processing apparatus control method according to the sixth aspect reduce a possibility that reflected light from a liquid surface of the processing liquid stored in the processing tank affects determination of foreign matter.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view schematically showing one example of a configuration of a substrate processing apparatus according to an embodiment;

FIGS. 2 and 3 are side views illustrating dipping of substrates into a processing liquid stored in a processing tank and removal of the substrates from the processing liquid;

FIG. 4 is a plan view illustrating the processing tank, a lifter, and a portion of a support piece;

FIGS. 5 and 6 schematically show image data obtained by image capturing using a camera;

FIG. 7 is a flowchart showing a group of steps for determining whether there is foreign matter;

FIG. 8 is a flowchart showing a group of steps for processing the substrates; and FIG. 9 is a flowchart showing a group of steps for generating first image data.

DESCRIPTION OF THE PREFERRED EMBODIMENTS

Figure 3:
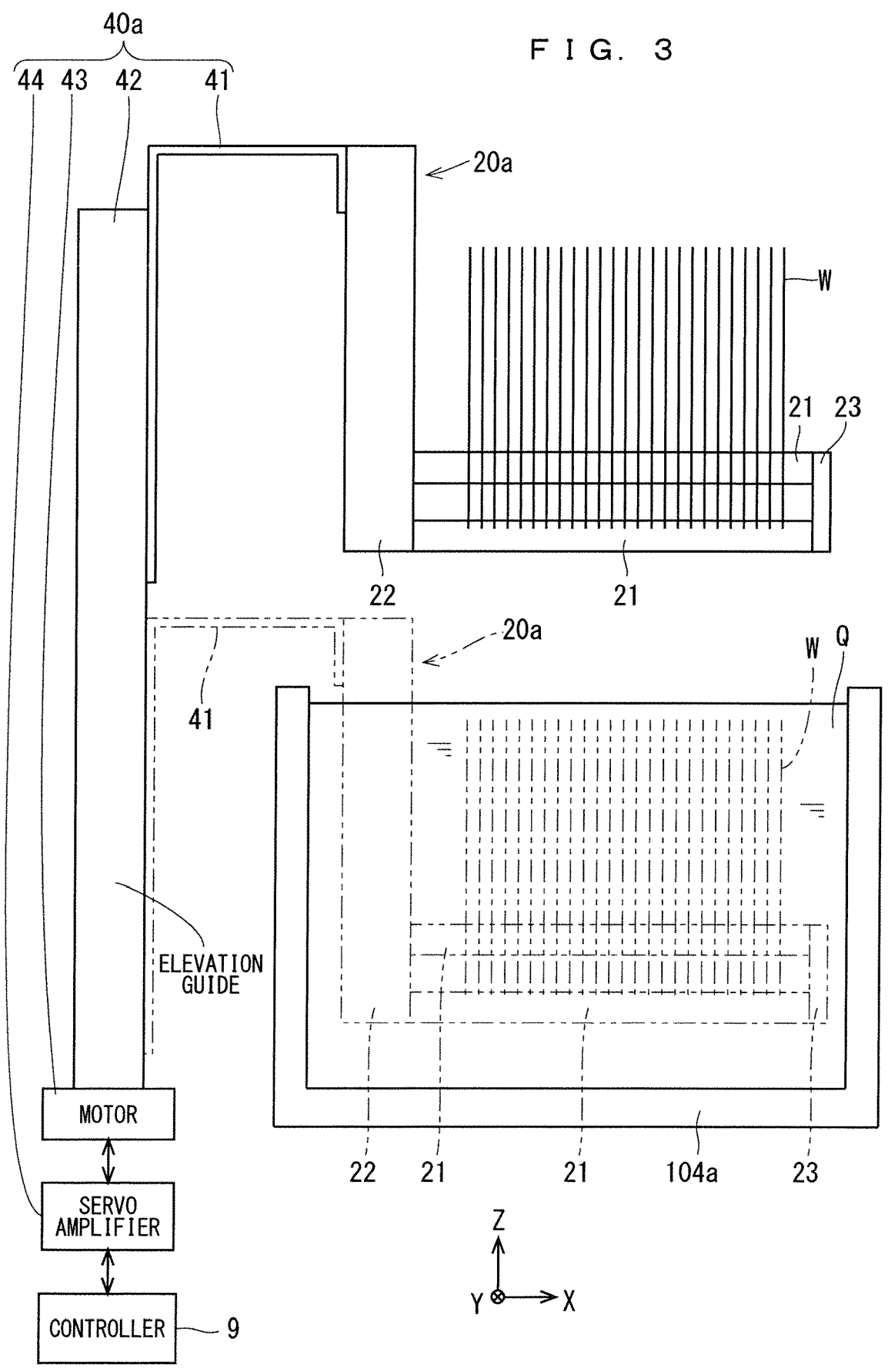

An embodiment will be described below with reference to the accompanying drawings. The drawings are schematically shown, and a configuration is omitted or simplified as appropriate for the convenience of description. A mutual relationship among sizes and positions of the configuration shown in the drawings are not necessarily accurate, and can be changed as appropriate.

In description made below, similar components bear the same reference signs, and have similar names and functions. Detailed description thereof is thus sometimes omitted to avoid redundancy.

In description made below, ordinal numbers, such as "first" and "second", are used for the sake of convenience for ease of understanding of the embodiment, and an order is not limited to an order represented by the ordinal numbers.

An expression indicating a relative or an absolute positional relationship (e.g., "in one direction", "along one direction", "parallel", "orthogonal", "central", "concentric", and "coaxial") not only exactly indicates the positional relationship but also indicates a state in which an angle or a distance is relatively changed within tolerance or to the extent that a similar function can be obtained unless otherwise noted. An expression indicating equality (e.g., "same", "equal", and "homogeneous") not only indicates quantitatively exact equality but also indicates a state in which there is a difference within tolerance or to the extent that a similar function can be obtained unless otherwise noted.

An expression indicating a shape (e.g., a "quadrangular shape" and a "cylindrical shape") not only geometrically exactly indicates the shape but also indicates a shape having irregularities, a chamfer, and the like to the extent that a similar effect can be obtained unless otherwise noted.

An expression "comprising", "being provided with", "being equipped with", "including", or "having" one component is not an exclusive expression excluding the presence of the other components.

An expression "being connected" includes not only a state of two elements being in contact with each other but also a state of two elements being away from each other with another element sandwiched therebetween unless otherwise noted.

An expression "at least one of A, B, and C" includes only A, only B, only C, any two of A, B, and C, and all of A, B, and C.

<Overview of Configuration of Substrate Processing Apparatus>

FIG. 1 is a plan view schematically showing one example of a configuration of a substrate processing apparatus 1 according to an embodiment. For unification of directions in the drawings below, a right-handed XYZ Cartesian coordinate axis is set as shown in FIG. 1. An XY plane herein represents a horizontal plane. A Z axis represents a vertical axis, and, more specifically, a Z direction is a vertically upward direction. A –X direction is a direction opposite an X direction, a –Y direction is a direction opposite a Y direction, and a –Z direction is a direction opposite the Z direction.

The substrate processing apparatus 1 is a processing apparatus of a batch type that collectively processes a plurality of substrates W. The substrate processing apparatus 1 includes a placement unit 2, a robot 4, an orientation transformation mechanism 5, a pusher 6, a transport mechanism 8, a processing unit 10, and a controller 9.

The controller 9 can perform overall control of operation of the substrate processing apparatus 1, for example. The controller 9 includes a processing unit, memory, a storage, and the like. The processing unit includes one or more central processing units (CPUs), and the like. The memory includes a volatile storage medium, such as random access memory (RAM). The storage includes a nonvolatile storage medium, such as a hard disk drive (HDD) and a solid state drive (SSD). The storage can store a program, various pieces of information, and the like. The processing unit can perform various functions by reading and executing the program stored in the storage, for example. In this case, the RAM is used as a workspace, for example, and stores temporarily-generated or -obtained information, and the like. At least portion of a functional configuration achieved by the controller 9 may be achieved by hardware, such as a dedicated electronic circuit.

The placement unit 2 has a function of placing a container F thereon. The container F has a function of containing the plurality of substrates W. The container F is placed on the placement unit 2 in a state of containing unprocessed substrates W, or is placed on the placement unit 2 in an empty state to contain processed substrates W. An example of the container F includes a front opening unified pod (FOUP) capable of containing a plurality of (e.g., 25) substrates W in a horizontal orientation stacked in the Z direction.

A process space 3 is adjacent to the placement unit 2 on a side in the Y direction. The robot 4, the orientation transformation mechanism 5, the pusher 6, the transport mechanism 8, and the processing unit 10 are arranged in the process space 3.

The placement unit 2 and the process space 3 are divided by a partition with an openable shutter (not illustrated). The shutter is opened and closed under control performed by the controller 9 to spatially separate the placement unit 2 and the process space 3 or to cause the placement unit 2 and the process space 3 to communicate with each other. In a state of the placement unit 2 and the process space 3 communicating with each other, the unprocessed substrates W are transported from the container F to the process space 3, or the processed substrates W are transported to the container F.

The substrates W are transported between the process space 3 and the container F by the robot 4. The robot 4 is pivotable in the horizontal plane. The robot 4 transfers the plurality of substrates W between the orientation transformation mechanism 5 and the container F with the shutter being open. The transfer is schematically indicated by an open arrow.

After receiving the substrates W from the container F via the robot 4, the orientation transformation mechanism 5 transforms an orientation of the plurality of substrates W from the horizontal orientation to an upright orientation. The orientation transformation mechanism 5 transforms the orientation of the plurality of substrates W from the upright orientation to the horizontal orientation before transferring the substrates W to the container F via the robot 4.

The processing unit 10 is disposed on a side of the orientation transformation mechanism 5 opposite the robot 4 (on a side in the –X direction in FIG. 1). The transport mechanism 8 is disposed on a side of the processing unit 10 opposite the orientation transformation mechanism 5 (on a side in the –X direction in FIG. 1).

The processing unit 10 includes processing parts 101, 102, 103, 104, and 105 arranged in this order in one direction (the –Y direction in FIG. 1). The transport mechanism 8 is horizontally movable from a position facing the pusher 6 (hereinafter referred to as a "standby position") along a direction of arrangement of the processing parts 101, 102, 103, 104, and 105 and a direction opposite the arrangement direction.

The pusher 6 is disposed between the orientation transformation mechanism 5 and the transport mechanism 8. The pusher 6 transfers the plurality of substrates W in the upright orientation between the orientation transformation mechanism 5 and the transport mechanism 8.

The transport mechanism 8 includes a pair of arms 81. Switching between collective holding of the plurality of substrates W and cancellation of holding depends on a position of the pair of arms 81. The arms 81 pivot around respective horizontal axes so that respective lower edges thereof approach each other to collectively sandwich and hold the plurality of substrates W. The arms 81 pivot around the respective horizontal axes so that the respective lower edges thereof are away from each other to cancel holding of the plurality of substrates W.

The transport mechanism 8 is movable along each of the Y direction and the –Y direction, so that the pair of arms 81 is positioned at positions (hereinafter also referred to as "processing positions") facing the respective processing parts 101, 102, 103, 104, and 105 and the standby position. At the standby position, the substrates W can be transferred between the orientation transformation mechanism 5 and the arms 81 via the pusher 6.

The processing unit 10 includes elevators 40a, 40b, and 40c. A lifter 20a has been attached to the elevator 40a. A lifter 20b is attached to the elevator 40b. A lifter 20c is attached to the elevator 40c. Each of the lifters 20a, 20b, and 20c functions as a substrate holding mechanism to hold the plurality of substrates W.

The elevator 40a and the lifter 20a are movable between the processing parts 103 and 104 along each of the Y direction and the –Y direction, and are positioned at processing positions corresponding to the processing parts 103 and 104. The elevator 40a and the lifter 20a are used for processing of the substrates W at the processing parts 103 and 104.

The elevator 40b and the lifter 20b are movable between the processing parts 101 and 102 along each of the Y direction and the –Y direction, and are positioned at processing positions corresponding to the processing parts 101 and 102. The elevator 40b and the lifter 20b are used for processing of the substrates W at the processing parts 101 and 102.

The elevator 40c and the lifter 20c are used for processing of the substrates W at the processing part 105.

The processing part 101 includes a processing tank 101b. The processing part 103 includes a processing tank 103b. The processing tanks 101b and 103b open in the Z direction. A predetermined chemical liquid to collectively process the plurality of substrates W is stored in each of the processing tanks 101b and 103b.

The substrates W dipped into the chemical liquid stored in the processing tank 101b are processed with the chemical liquid. The substrates W dipped into the chemical liquid stored in the processing tank 103b are processed with the chemical liquid. The chemical liquid may or may not differ between the processing tanks 101b and 103b.

The processing part 102 includes a processing tank 102a. The processing part 104 includes a processing tank 104a. The processing tanks 102a and 104a open in the Z direction. A rinse liquid (e.g., pure water) as a processing liquid to clean the chemical liquid stored in the processing tank 101b off the substrates W is stored in the processing tank 102a. A rinse liquid (e.g., pure water) as a processing liquid to clean the chemical liquid stored in the processing tank 103b off the substrates W is stored in the processing tank 104a. The substrates W dipped into the rinse liquid stored in the processing tank 102a are cleaned with the rinse liquid. The substrates W dipped into the rinse liquid stored in the processing tank 104a are cleaned with the rinse liquid.

The processing part 105 supplies an organic solvent, such as isopropyl alcohol, to the substrates W in a reduced pressure atmosphere to dry the substrates W, for example.

The substrates W are dipped into and removed from the processing tanks 103b and 104a by the elevator 40a and the lifter 20a. The elevator 40a has a function of dipping the lifter 20a into the chemical liquid stored in the processing tank 103b, a function of removing the lifter 20a from the chemical liquid, a function of dipping the lifter 20a into the rinse liquid stored in the processing tank 104a, and a function of removing the lifter 20a from the rinse liquid.

The substrates W are dipped into and removed from the processing tanks 101b and 102a by the elevator 40b and the lifter 20b. The elevator 40b has a function of dipping the lifter 20b into the chemical liquid stored in the processing tank 101b, a function of removing the lifter 20b from the chemical liquid, a function of dipping the lifter 20b into the rinse liquid stored in the processing tank 102a, and a function of removing the lifter 20b from the rinse liquid.

The substrates W are loaded into and removed from the processing part 105 by the elevator 40c and the lifter 20c.

The plurality of substrates W are transferred between the lifter 20a and the transport mechanism 8 in a state of the lifter 20a positioned above the processing tanks 103b and 104a by being raised by the elevator 40a in the Z direction. The plurality of substrates W are transferred between the lifter 20b and the transport mechanism 8 in a state of the lifter 20b positioned above the processing tanks 101b and 102a by being raised by the elevator 40b in the Z direction. The plurality of substrates W are transferred between the lifter 20c and the transport mechanism 8 in a state of the lifter 20c positioned above the processing part 105 by being raised by the elevator 40c in the Z direction.

Specifically, in these states, the transport mechanism 8 moves to any of the processing positions to be aligned with any of the lifters 20a, 20b, and 20c along the X direction, and the transfer is achieved by holding and cancellation described above, for example.

At each of the processing parts 101 and 103, the substrates W are processed with the chemical liquid as the processing liquid, for example. At each of the processing parts 102 and 104, the chemical liquid on the substrates W is rinsed (hereinafter expressed as "cleaned"), for example. At the processing part 105, drying processing is performed, for example.

FIG. 2 is a side view illustrating dipping of the substrates W into the processing liquid stored in the processing tank 104a and removal of the substrates W from the processing liquid as viewed along the –X direction. FIG. 3 is a side view illustrating dipping of the substrates W into the processing liquid stored in the processing tank 104a and removal of the substrates W from the processing liquid as viewed along the Y direction.

The elevator 40a is omitted in FIG. 2 to avoid clutter in FIG. 2. A case where a rinse liquid Q is stored in the processing tank 104a is illustrated in each of FIGS. 2 and 3.

In each of FIGS. 2 and 3, a state of the substrates W being dipped into the rinse liquid Q together with the lifter 20a is indicated by alternate long and short dashed lines. In each of FIGS. 2 and 3, a state of the substrates W having been removed from the rinse liquid Q together with the lifter 20a is indicated by solid lines regardless of whether the state is before or after dipping. In FIG. 2, transition between the state of the substrates W having been removed from the rinse liquid Q together with the lifter 20a and the state of the substrates W being dipped into the rinse liquid Q together with the lifter 20a is indicated by alternate long and two short dashed lines.

The lifter 20a includes a plurality of rods 21 and a plate 22. For example, the lifter 20a includes three rods 21. Each of the rods 21 supports the plurality of substrates W positioned at intervals. For example, each of the rods 21 has 25 grooves away from each other in the X direction although the grooves are not illustrated in FIGS. 2 and 3.

The plate 22 expands perpendicularly to the X direction, for example. An end (e.g., an end in the –X direction) of each of the rods 21 is connected to the plate 22. By including the plurality of rods 21 and the plate 22, the lifter 20a has a function of holding the plurality of substrates W. The lifters 20b and 20c each have a similar configuration to the lifter 20a, and have the function of holding the plurality of substrates W.

A camera 30 of the processing part 104 is also illustrated in FIG. 2. The camera 30 is omitted in FIG. 1 to avoid clutter in FIG. 1. The camera 30 is disposed on a side in the Z direction of the lifter 20a relative to the processing tank 104a. The camera 30 captures an image of the interior of the processing tank 104a from a side of the lifter 20a opposite the processing tank 104a.

The camera 30 captures the image of the interior of the processing tank 104a under control performed by the controller 9 to generate image data. The image data is transmitted to the controller 9, and is subjected to determination processing, which will be described below.

The processing part 102 may include the camera 30 disposed on a side in the Z direction of the lifter 20b relative to the processing tank 102a. In this case, the camera 30 disposed on the side in the Z direction of the lifter 20*a* relative to the processing tank 104*a* may be omitted. Alternatively, the processing part 105 may include the camera 30 disposed on a side in the Z direction of the lifter 20*c*. The substrate processing apparatus 1 includes the above-mentioned controller 9 and one or more cameras 30.

Referring to FIG. 3, the elevator 40*a* includes a support piece 41, an elevation guide 42, a motor 43, and a servo amplifier 44.

The support piece 41 supports the plate 22 of the lifter 20*a* from a side in the −X direction. The elevation guide 42 guides elevation of the support piece 41, specifically, movement of the support piece 41 in the Z direction and movement of the support piece 41 in the −Z direction. For example, the elevation guide 42 includes a ball screw (not illustrated) connected to a rotation axis of the motor 43 and a rod (not illustrated) having a tap to fit the ball screw grooved therein and connected to the plate 22. The motor 43 is driven by the servo amplifier 44 under control performed by the controller 9 to elevate the support piece 41. The controller 9 controls the motor 43 via the servo amplifier 44 to move the lifter 20*a* to a predetermined position.

For example, the motor 43 is a stepping motor. The servo amplifier 44 not only drives the motor 43 upon receiving rotation instructions from the controller 9 but also transmits information on a vertical position of the support piece 41 and, further, a vertical position of the lifter 20*a* from the motor 43 to the controller 9.

The elevators 40*b* and 40*c* each have a similar configuration to the elevator 40*a*, and respectively elevate the lifters 20*b* and 20*c* to move the lifters 20*b* and 20*c* to predetermined positions.

<Transfer of Substrates Between Lifters and Transport Mechanism>

An example of a flow of subjecting the substrates W to processing at the processing parts 101, 102, 103, 104, and 105 is shown by a process divided as shown below:

(i) the pusher 6 transferring the substrates W to the transport mechanism 8;

(ii) the transport mechanism 8 moving in the Y direction to the processing position corresponding to the processing part 101;

(iii) transferring the substrates W from the transport mechanism 8 to the lifter 20*b* positioned above the processing tank 101*b* by the elevator 40*b;*

(iv) the elevator 40*b* lowering the lifter 20*b* to dip the lifter 20*b* and the substrates W held by the lifter 20*b* into the chemical liquid stored in the processing tank 101*b;*

(v) the elevator 40*b* raising the lifter 20*b* to remove the lifter 20*b* and the substrates W held by the lifter 20*b* from the chemical liquid stored in the processing tank 101*b;*

(vi) the elevator 40*b* moving in the −Y direction to the processing position corresponding to the processing part 102;

(vii) the elevator 40*b* lowering the lifter 20*b* to dip the lifter 20*b* and the substrates W held by the lifter 20*b* into the rinse liquid stored in the processing tank 102*a;*

(viii) the elevator 40*b* raising the lifter 20*b* to remove the lifter 20*b* and the substrates W held by the lifter 20*b* from the rinse liquid stored in the processing tank 102*a;*

(ix) the transport mechanism 8 moving to the processing position corresponding to the processing part 102;

(x) transferring the substrates W from the lifter 20*b* which is positioned above the processing tank 102*a* by the elevator 40*b*, to the transport mechanism 8;

(xi) the transport mechanism 8 moving in the −Y direction to the processing position corresponding to the processing part 103;

(xii) transferring the substrates W from the transport mechanism 8 to the lifter 20*a* which is positioned above the processing tank 103*b* by the elevator 40*a;*

(xiii) the elevator 40*a* lowering the lifter 20*a* to dip the lifter 20*a* and the substrates W held by the lifter 20*a* into the chemical liquid stored in the processing tank 103*b;*

(xiv) the elevator 40*a* raising the lifter 20*a* to remove the lifter 20*a* and the substrates W held by the lifter 20*a* from the chemical liquid stored in the processing tank 103*b;*

(xv) the elevator 40*a* moving in the −Y direction to the processing position corresponding to the processing part 104;

(xvi) the elevator 40*a* lowering the lifter 20*a* to dip the lifter 20*a* and the substrates W held by the lifter 20*a* into the rinse liquid Q stored in the processing tank 104*a;*

(xvii) the elevator 40*a* raising the lifter 20*a* to remove the lifter 20*a* and the substrates W held by the lifter 20*a* from the rinse liquid Q;

(xviii) the transport mechanism 8 moving to the processing position corresponding to the processing part 104;

(xix) transferring the substrates W from the lifter 20*a* which is positioned above the processing tank 104*a* by the elevator 40*a*, to the transport mechanism 8;

(xx) the transport mechanism 8 moving in the −Y direction to the processing position corresponding to the processing part 105;

(xxi) transferring the substrates W from the transport mechanism 8 to the lifter 20*c* which is positioned above the processing part 105 by the elevator 40*c*; and (xxii) the lifter 20*c* loading the substrates W into the processing part 105 to dry the substrates W.

The camera 30 captures the image of the interior of the processing tank 104*a* after the step (xix), for example, after the step (xix) and before the step (xxi). When the processing part 102 includes the camera 30, the camera 30 captures an image of the interior of the processing tank 102*a* after the step (x), for example, after the step (x) and before the step (xii).

<Processing Based on Image Data>

FIG. 4 is a plan view illustrating the processing tank 104*a*, the lifter 20*a*, and a portion of the support piece 41 as viewed along the −Z direction. A case where there is a lost portion D in the processing tank 104*a* is illustrated in FIG. 4. Regions 300, 30A, 30B, and 30C in the image data, which will be described below, are indicated by dashed lines.

The camera 30 captures at least images of the interior of the processing tank 104*a*, an object present between the interior and the camera 30 along the Z direction, and the lost portion D if there is the lost portion D. The lifter 20*a* does not hold the substrates W during the image capturing. The object specifically includes the lifter 20*a* and at least portion of the elevator 40*a* (e.g., a portion of the support piece 41 on a side in the X direction).

The region 30A is a region in which an image of the object has been captured in the image data. The region 30A expands in plan view, specifically, as viewed along the −Z direction.

The region 30A is a region in which at least an image of the lifter 20a has been captured, and it can be said that the region 30A is a region in which an image of the lifter 20a and an image of the at least portion of the elevator 40a have been captured.

The region 300 is a region in which the image of the interior of the processing tank 104a has been captured. An outline of the region 300, however, is drawn slightly inward of the interior of the processing tank 104a for ease of understanding.

The region 30C is (I) a region in the region 300 other than the region 30A or (II) a region in the region 300 other than the regions 30A and 30B. It can be said that the region 30C is a region remaining after the region 30A is excluded from the region 300 in a case of (I), and the region 30C is a region remaining after the regions 30A and 30B are excluded from the region 300 in a case of (II). From this perspective, the regions 30A and 30B are hereinafter also referred to as excluded regions 30A and 30B, and the region 30C is hereinafter also referred to as a remaining region 30C.

In Case of (I)

FIG. 5 schematically shows image data G1 obtained by image capturing using the camera 30 when the region 30C is a region obtained by excluding the region 30A from the region 300. FIG. 5 shows a region D1 occupied by the lost portion D in the region 30C.

The presence or the absence of the region D1 can be determined by comparing a gradient of the image data G1 distributed in the region 30C with a threshold for the gradient. Technology of comparing the distributed gradient with the threshold to identify the region itself is known, so that details thereof are omitted herein. For example, the lost portion D is a portion of a substrate W or the substrate as a whole, and is darker than the interior of the processing tank 104a where there is no lost portion D. In description made below, a gradient increasing with increasing brightness is used. The region D1 is identified as a region indicating a gradient lower than a first threshold.

When there is the region D1, it is determined that there is the lost portion D in the processing tank 104a. More generally, determination of the presence or the absence of the region D1 contributes to determination of the presence or the absence of foreign matter in the processing tank 104a.

The presence or the absence of the region D1 is determined in the remaining region 30C remaining after the excluded region 30A is excluded from the region 300, so that, even if images of the lifter 20a functioning as the substrate holding mechanism and the support piece 41 are captured, a possibility that they are determined as the lost portion D is reduced.

In Case of (II)

FIG. 6 schematically shows image data G2 obtained by image capturing using the camera 30 when the remaining region 30C is a region obtained by excluding the excluded regions 30A and 30B from the region 300. FIG. 6 shows a region D2 occupied by the lost portion D in the remaining region 30C.

The excluded region 30B is a region occupied by a shadow of the lifter 20a whose image has been captured in the region 300. The excluded region 30B herein includes a region occupied by a shadow of the support piece 41 whose image has been captured in the region 300. These shadows are derived from ambient light (not illustrated) entering the processing tank 104a, the lifter 20a, and the elevator 40a. For example, the ambient light lightens the interior of the processing tank 104a as a whole, but locally darkens a portion of the interior obstructed by the lifter 20a and the elevator 40a.

The shadows are dark, so that there is a possibility that the shadows are erroneously determined as the lost portion D in determination using the gradient. The remaining region 30C not including the excluded region 30B contributes to reduction of the possibility.

In this case, the presence or the absence of the region D2 can be determined by comparing a gradient of the image data G2 distributed in the region 30C with a threshold as with the region D1. Determination of the presence or the absence of the region D2 contributes to determination of the presence or the absence of foreign matter in the processing tank 104a.

The presence or the absence of the region D2 is determined in the remaining region 30C remaining after the excluded regions 30A and 30B are excluded from the region 300, so that, even if the images of the lifter 20a functioning as the substrate holding mechanism and the support piece 41 are captured, a possibility that they and the shadows of them are determined as the lost portion D is reduced.

<Identification of Excluded Regions>

The excluded regions 30A and 30B are identified as described below using a second threshold greater than the first threshold, for example. The images of the lifter 20a and the support piece 41 are captured by the camera 30 so that the lifter 20a and the support piece 41 are darker than the processing tank 104a, for example. A region having a gradient (brightness) lower than the second threshold and higher than the first threshold can be identified as the excluded region 30A.

The images of the shadows of the lifter 20a and the support piece 41 are captured so that the shadows of the lifter 20a and the support piece 41 are darker than the lifter 20a and the support piece 41, for example. Thus, by reducing the second threshold, regions having a gradient (brightness) lower than the second threshold and higher than the first threshold can be identified as the excluded regions 30A and 30B. The first threshold and the second threshold are determined in advance, or determined in response to distribution of gradient values in the image data, for example.

Alternatively, the excluded regions 30A and 30B may be identified in advance, for example. Shapes of the lifter 20a and the support piece 41 are already known as design specifications, so that the excluded region 30A can be identified in advance. The excluded region 30B can be identified in advance as a region obtained by expanding the excluded region 30A by a margin in the region 300.

<Determination of Presence or Absence of Foreign Matter>

In each of the cases of (I) and (II), it is determined that there is foreign matter when the region D1 or D2 has a larger area than a third threshold, for example. This contributes to reduction of a possibility that the presence of foreign matter, for example, the lost portion D is erroneously detected despite the absence of the lost portion D. Comparison between the area of the region where the gradient in a predetermined range is distributed and the threshold itself is known, so that details thereof are omitted herein.

It is contemplated that a plurality of small regions D1 or a plurality of small regions D2 determined to be larger than the third threshold may be identified by an error caused in identification of the excluded regions 30A and 30B or an error caused in comparison between gradient values distributed in the remaining region 30C and the third threshold. When the plurality of regions D1 or the plurality of regions D2 are obtained, the area compared with the third threshold is not the total area of the plurality of regions D1 or the total area of the plurality of regions D2, for example. Comparison of the area of the region D1 or D2 as a unitary individual region with the third threshold contributes to reduction of a possibility that the plurality of regions D1 (or regions D2) are collectively erroneously recognized as a large region D1 (or region D2).

FIG. 7 is a flowchart showing a group of steps for determining whether there is foreign matter in the processing tank 104a. The flowchart is titled "FOREIGN MATTER DETERMINATION PROCESSING" reflecting the meaning thereof. The group of steps includes steps S11, S12, and S13 performed in this order.

Step S11 is a step of capturing an image using the camera 30 under control performed by the controller 9 to generate first image data. The first image data is illustrated as the image data G1 and the image data G2 in the above-mentioned example. The first image data is generated by the camera 30 itself, for example, and the first image data is provided to the controller 9 to be subjected to processing performed by the controller 9.

Step S12 is a step of identifying the excluded region 30A or a step of identifying the excluded regions 30A and 30B. Identification is performed by the controller 9 by the above-mentioned method. A case where both the excluded regions 30A and 30B are identified is taken as an example in FIG. 7 for simplicity of illustration.

Step S13 is a step of determining foreign matter in the remaining region 30C. When only the excluded region 30A is identified in step S12, determination is made by the controller 9 comparing the region D1 and the second threshold. When the excluded regions 30A and 30B are identified in step S12, determination is made by the controller 9 comparing the region D2 and the second threshold.

For example, when the area of the region D1 or the area of the region D2 is larger than the third threshold, it is determined that there is foreign matter, specifically, the lost portion D, for example.

Steps S11, S12, and S13 are performed as described above, so that, even if the images of the lifter 20a functioning as the substrate holding mechanism and the support piece 41 or the shadows of them are captured, the presence or the absence of the lost portion D can be determined while the possibility that they are determined as the lost portion D is reduced.

<Position of Substrate Holding Mechanism During Image Capturing>

FIG. 8 is a flowchart showing a group of steps for processing the substrates W in the processing tank 104a. The flowchart is titled "SUBSTRATE PROCESSING IN PROCESSING TANK" reflecting the meaning thereof. The group of steps shown in FIG. 8 is performed prior to the group of steps shown in FIG. 7.

The group of steps shown in FIG. 8 includes steps S21, S22, S23, S24, and S25 performed in this order.

Step S21 is a step of placing the substrates W on the lifter 20a, and corresponds to the above-mentioned step (xii). Placement is performed by the transport mechanism 8.

Step S22 is a step of dipping the substrates W into the processing tank 104a, more specifically, into the rinse liquid Q stored in the processing tank 104a. Step S22 corresponds to the above-mentioned step (xvi). Dipping is performed by the elevator 40a.

Step S23 is a step of securing time necessary for processing of the substrates W in the processing tank 104a. In step S23, determination on whether predetermined time has elapsed since performing step S22 is made. When determination is negative, that is, when the predetermined time has not elapsed since performing step S22, step S23 is repeatedly performed. When determination is affirmative, that is, when the predetermined time has elapsed since performing step S22, step S24 is performed.

Step S24 is a step of raising the substrates W from the processing tank 104a. The substrates W are removed from the rinse liquid Q by raising. Step S24 corresponds to the above-mentioned step (xvii). Raising (or removal) is performed by the elevator 40a.

Step S25 is a step of moving the substrates W from the lifter 20a. More specifically, step S25 is a step of transferring the substrates W from the lifter 20a to the transport mechanism 8. Step S25 corresponds to the above-mentioned step (xix). Movement (or transfer) is performed by the transport mechanism 8.

The group of steps shown in FIG. 8 may further include step S26. Processing of the substrates W in the processing tank 104a is performed regardless of whether step S26 is performed. A frame of step S26 indicated by a broken line indicates that step S26 can be omitted.

Step S26 is performed after step S25. Step S26 is a step of dipping the lifter 20a no longer holding the substrates W by performing step S25 into the processing tank 104a, more specifically, into the rinse liquid Q. Advantages in performing step S26 will be described below.

In a case where the flowchart of FIG. 8 ends upon performing step S25, when the camera 30 captures the image in step S11 thereafter, the substrates W are not arranged on the lifter 20a, and the lifter 20a and the support piece 41 are positioned away from the processing tank 104a in the Z direction (see the positions of the lifter 20a and the support piece 41 indicated by solid lines in FIG. 3).

In a case where the flowchart of FIG. 8 ends upon performing step S26, when the camera 30 captures the image in step S11 thereafter, the substrates W are not arranged on the lifter 20a, and the lifter 20a and the support piece 41 are positioned at substantially the same positions as the processing tank 104a in the Z direction (see the positions of the lifter and the support piece 41 indicated by dashed lines in FIG. 3).

The images of the lifter 20a and the support piece 41 are captured so that the lifter 20a and the support piece 41 are larger as they are closer to the camera 30. The proportion of the excluded region 30A or the excluded regions 30A and 30B to the region 300 is smaller in a case where the flowchart of FIG. 8 ends upon performing step S26 than in a case where the flowchart of FIG. 8 ends upon performing step S25. This is advantageous in terms of expansion of the remaining region 30C targeted for determination in detection of the lost portion D in the processing tank 104a.

<Influence of Liquid in Processing Tank>

In a state of the rinse liquid Q being stored in the processing tank 104a, reflected light from a liquid surface of the rinse liquid Q affects the image data. The reflected light varies temporally and spatially due to shaking of the liquid surface. The variation can affect determination of foreign matter described above.

In step S11, the camera 30 may capture the image a plurality of times to obtain a plurality of pieces of second image data. Temporal smoothing of the plurality of pieces of second image data to obtain the first image data contributes to reduction of a possibility that the reflected light from the liquid surface of the rinse liquid Q affects determination of foreign matter.

FIG. 9 is a flowchart showing a group of steps for generating the first image data using the pieces of second image data. The group of steps includes steps S111 and S112 performed in this order. Steps S111 and S112 are included in step S11.

Step S111 is a step of generating the plurality of pieces of second image data. The plurality of pieces of second image data are generated by capturing the image of the interior of the processing tank 104*a* at a plurality of different times.

Step S112 is a step of generating the first image data from the plurality of pieces of second image data. Specifically, the plurality of pieces of second image data are temporally smoothed to generate the first image data. Smoothing is performed by calculating an average value of mutually corresponding pixels in the plurality of pieces of second image data, for example. The average value is calculated by an arithmetic mean and a geometric mean, for example.

The camera 30 may capture the image of the interior of the processing tank 104*a* with the rinse liquid Q discharged from the processing tank 104*a*. In this case, after the step (xix), a step of discharging the rinse liquid Q is performed before image capturing using the camera 30.

In this case, the generated image data is not affected by the reflected light from the liquid surface of the rinse liquid Q. Image capturing performed with the rinse liquid Q discharged from the processing tank 104*a* also contributes to reduction of the possibility that the reflected light from the liquid surface of the rinse liquid Q affects determination of foreign matter.

The above-mentioned description relating to the processing part 104 applies to the processing parts 102 and 105. Specifically, when the processing part 102 includes the camera 30, the lifter 20*a* is read as the lifter 20*b*, the processing tank 104*a* is read as the processing tank 102*a*, and the elevator 40*a* is read as the elevator 40*b* in the above-mentioned description.

Modifications

In the above-mentioned embodiment, the presence or the absence of foreign matter may be determined without identifying each of the excluded regions 30A and 30B and the remaining region 30C, for example. For example, a value corresponding to the area of the excluded region 30A in the image data G1 may be used as the third threshold, and, from among the gradient distributed in the region 300, the area of a region indicating a gradient higher than the first threshold may be compared with the third threshold. Alternatively, a value corresponding to the area of the excluded regions 30A and 30B in the image data G2 may be used as the third threshold, and, from among the gradient distributed in the region 300, the area of a region indicating a gradient higher than the first threshold may be compared with the third threshold. In these cases, the third threshold can be set in advance from design values of the lifter 20*a* and the support piece 41, for example.

While the present disclosure has been described in detail, the foregoing description is in all aspects illustrative and not restrictive. It is understood that numerous unillustrated modifications can be devised.

What is claimed is:

1. A substrate processing apparatus control method for controlling a substrate processing apparatus, wherein the substrate processing apparatus comprises:

a processing tank to store a processing liquid into which a plurality of substrates are dipped to collectively process the plurality of substrates;

a holder having a function of collectively holding the plurality of substrates;

an elevator being a mechanism having a function of dipping the holder into the processing liquid and a function of removing the holder from the processing liquid; and a camera to capture an image of an interior of the processing tank and an image of the holder from a side of the holder opposite the processing tank to generate image data, and the substrate processing apparatus control method comprises:

a) causing, in a state of the holder not holding the plurality of substrates, the camera to capture the image of the holder and the image of the interior to generate first image data;

b) identifying, in a first region indicated by the first image data, a second region being a region in which at least the image of the holder has been captured; and c) comparing a gradient of the first image data distributed in a third region with a threshold for the gradient, the third region being a region in the first region other than the second region.

2. The substrate processing apparatus control method according to claim 1, further comprising:

identifying further a fourth region in which an image of a shadow of the holder has been captured in the first region, and obtaining the third region by excluding the second region and the fourth region from the first region.

3. The substrate processing apparatus control method according to claim 2, comprising:

performing causing the camera to generate the first image data with the processing liquid discharged from the processing tank.

4. The substrate processing apparatus control method according to claim 2, comprising:

performing causing the camera to generate the first image data with the processing liquid stored in the processing tank, and obtaining the first image data by temporal smoothing of a plurality of pieces of second image data generated by capturing the image of the interior at different times.

5. The substrate processing apparatus control method according to claim 1, wherein the second region includes a region in which an image of at least portion of the elevator has been captured in the first region.

6. The substrate processing apparatus control method according to claim 5, further comprising:

identifying further a fourth region in which an image of a shadow of the at least portion of the elevator has been captured in the first region, and obtaining the third region by excluding the second region and the fourth region from the first region.

7. The substrate processing apparatus control method according to claim 6, comprising:

performing causing the camera to generate the first image data with the processing liquid discharged from the processing tank.

8. The substrate processing apparatus control method according to claim 6, comprising:

performing causing the camera to generate the first image data with the processing liquid stored in the processing tank, and obtaining the first image data by temporal smoothing of a plurality of pieces of second image data generated by capturing the image of the interior at different times.

9. The substrate processing apparatus control method according to claim 5, comprising:

performing causing the camera to generate the first image data with the processing liquid discharged from the processing tank.

10. The substrate processing apparatus control method according to claim 5, comprising:

performing causing the camera to generate the first image data with the processing liquid stored in the processing tank, and obtaining the first image data by temporal smoothing of a plurality of pieces of second image data generated by capturing the image of the interior at different times.

11. The substrate processing apparatus control method according to claim 1, comprising:

performing causing the camera to generate the first image data with the processing liquid discharged from the processing tank.

12. The substrate processing apparatus control method according to claim 1, comprising:

performing causing the camera to generate the first image data with the processing liquid stored in the processing tank, and obtaining the first image data by temporal smoothing of a plurality of pieces of second image data generated by capturing the image of the interior at different times.

13. A substrate processing apparatus comprising:

a processing tank to store a processing liquid into which a plurality of substrates are dipped to collectively process the plurality of substrates;

a holder having a function of collectively holding the plurality of substrates;

an elevator being a mechanism having a function of dipping the holder into the processing liquid and a function of removing the holder from the processing liquid;

a camera to capture an image of an interior of the processing tank and an image of the holder from a side of the holder opposite the processing tank to generate image data; and a controller, wherein the controller causes, in a state of the holder not holding the plurality of substrates, the camera to capture the image of the holder and the image of the interior to generate first image data;

identifies, in a first region indicated by the first image data, a second region being a region in which the image of the holder has been captured; and compares a gradient of the first image data in a third region with a threshold for the gradient, the third region being obtained by excluding the second region from the first region.

14. The substrate processing apparatus according to claim 13, wherein the controller identifies further a fourth region in which an image of a shadow of the holder has been captured in the first region, and obtaining the third region by excluding the second region and the fourth region from the first region.

15. The substrate processing apparatus according to claim 14, wherein the controller performs causing the camera to generate the first image data with the processing liquid stored in the processing tank, and obtains the first image data by temporal smoothing of a plurality of pieces of second image data generated by capturing the image of the interior at different times.

16. The substrate processing apparatus according to claim 13, wherein the second region includes a region in which an image of at least portion of the elevator has been captured in the first region.

17. The substrate processing apparatus according to claim 16, wherein the controller identifies further a fourth region in which an image of a shadow of the at least portion of the elevator has been captured in the first region, and obtains the third region by excluding the second region and the fourth region from the first region.

18. The substrate processing apparatus according to claim 16, wherein the controller performs causing the camera to generate the first image data with the processing liquid stored in the processing tank, and obtains the first image data by temporal smoothing of a plurality of pieces of second image data generated by capturing the image of the interior at different times.

19. The substrate processing apparatus according to claim 13, wherein the controller performs causing the camera to generate the first image data with the processing liquid discharged from the processing tank.

20. The substrate processing apparatus according to claim 13, wherein the controller performs causing the camera to generate the first image data with the processing liquid stored in the processing tank, and obtains the first image data by temporal smoothing of a plurality of pieces of second image data generated by capturing the image of the interior at different times.

\* \* \* \* \*